United States Patent [19]

Ogasawara

[11] Patent Number: 4,974,060
[45] Date of Patent: Nov. 27, 1990

[54] SEMICONDUCTOR INTEGRATED CIRCUIT DEVICE AND METHOD OF MANUFACTURING THE SAME

[75] Inventor: Makoto Ogasawara, Ohme, Japan
[73] Assignee: Hitachi, Ltd., Tokyo, Japan
[21] Appl. No.: 304,580
[22] Filed: Feb. 1, 1989
[30] Foreign Application Priority Data
  Feb. 3, 1988 [JP] Japan .................. 63-23301
[51] Int. Cl.$^5$ ................ H01L 29/780; H01L 27/020; H01L 29/340
[52] U.S. Cl. ................ 357/23.600; 357/23.400; 357/41; 357/51; 357/54; 357/55
[58] Field of Search ................ 357/23.4, 23.6, 41, 357/51, 55, 54

[56] References Cited

U.S. PATENT DOCUMENTS

| | | | |
|---|---|---|---|
| 4,163,243 | 7/1979 | Kamins et al. | 357/41 |
| 4,434,433 | 2/1984 | Nishizawa | 357/22 |
| 4,630,088 | 12/1986 | Ogura et al. | 357/23.6 |
| 4,712,123 | 12/1987 | Miyatake et al. | 357/23.6 |
| 4,713,678 | 12/1987 | Womack et al. | 357/23.6 |
| 4,737,829 | 4/1988 | Morimoto et al. | 357/23.6 |
| 4,794,434 | 12/1988 | Pelley, III | 357/23.6 |
| 4,833,647 | 5/1989 | Maeda et al. | 365/182 |

OTHER PUBLICATIONS

A Trench Transistor Cross Point D-RAM Cell, Richardson et al., IEDM Technical Digest, 1985, pp. 714–717.

Primary Examiner—Rolf Hille
Assistant Examiner—Peter Toby Brown
Attorney, Agent, or Firm—Antonelli, Terry, Stout & Kraus

[57] ABSTRACT

A dynamic RAM having memory cells each being constructed of a MISFET and a capacitor element which are formed in the shape of a pillar on the domain of a semiconductor substrate where a bit line and a word line intersect. The transfer MISFET is formed at the lower part of the pillar-shaped memory cell, while the capacitor element is formed at the upper part thereof, and a plate electrode to which the reference potential of the capacitor element is applied is isolated from the semiconductor substrate, so that $\frac{1}{2} V_{cc}$ can be adopted as the reference potential of the capacitor element.

15 Claims, 12 Drawing Sheets

4,974,060

SEMICONDUCTOR INTEGRATED CIRCUIT DEVICE AND METHOD OF MANUFACTURING THE SAME

BACKGROUND OF THE INVENTION

The present invention relates to semiconductor integrated circuit devices, and more particularly to techniques which are effective when applied to a semiconductor integrated circuit device having a dynamic RAM (Dynamic Random Access Memory).

The memory cell of a dynamic RAM is constructed of a MISFET for selecting the memory cell (a transfer MISFET) and a capacitor element for storing information, which is connected in series with one of the semiconductor regions of the MISFET. In order to increase the degree of integration of the DRAM, researches have been made on techniques which are intended to reduce the area of the memory cell occupying a surface of a semiconductor substrate, without lowering the capacitance of the capacitor element. As one of such techniques, an example wherein a deep trench is formed in the principal surface of the semiconductor substrate so as to form the transfer MISFET and the capacitor element therein, in overlapping fashion, is described in "IEDM Technical Digest," pp. 714–717, 1985. According to this technique, the capacitor is formed at the lower part of the trench, while the transfer MISFET is formed at the upper part of the trench. In addition, the capacitor element is formed by providing a dielectric film on the wall surface of the trench and thereafter burying polycrystalline silicon in the resulting trench. The film of the polycrystalline silicon buried in the trench serves as one electrode of the capacitor element, and the semiconductor substrate as the other electrode. Besides, the polycrystalline silicon film of the capacitor element is connected to the source or drain of the transfer MISFET formed at the upper part of the trench. Thus, in writing information, a ground potential $V_{ss}$, e.g., 0 V or a power source potential $V_{cc}$, e.g., 5 V is applied to the polycrystalline silicon film via the transfer MISFET in accordance with the information. The semiconductor substrate serving as the other electrode of the capacitor element is fixed to the ground potential $V_{ss}$ or a still lower potential in order to stabilize the operations of N-channel MISFETs formed on the principal surface thereof. This potential of the semiconductor substrate becomes the reference potential of the capacitor element. Since, in this manner, the semiconductor substrate is used as the other electrode of the capacitor, a low impurity concentration in the surroundings of the trench of the semiconductor substrate incurs the drawback that, when the information of "H" (high level), namely, the information corresponding to the power source potential $V_{cc}$ is to be written, the surroundings of the trench are depleted, so a predetermined capacitance fails to be attained. Therefore, the deep part of the semiconductor substrate where the capacitor element is provided is turned into the $p^+$-type (the impurity concentration of a p-type impurity is high) so as to prevent the depletion. The vicinity of the source or drain of the transfer MISFET, however, is formed of a p-type region for the reason that the MISFET fails to operate when the impurity concentration of a p-type impurity is high.

SUMMARY OF THE INVENTION

The inventor studied the memory cell of the prior art technique stated above, and has found problems to be mentioned hereunder.

The semiconductor substrate is used as the other electrode of the capacitor element, and the potential of this semiconductor substrate is set at the ground potential $V_{ss}$ or below. Therefore, $\frac{1}{2} V_{cc}$ (a voltage nearly equal to a half of the power source voltage $V_{cc}$) cannot be adopted as the reference potential of the capacitor element. This has led to the problem that the dielectric film of the capacitor element cannot be thinned. Meanwhile, as stated before, the part of the semiconductor substrate to serve as the other electrode of the capacitor element is turned into the $p^+$-type, whereas the impurity concentration of the p-type impurity in the semiconductor substrate must be held low in the vicinity of the source or drain of the transfer MISFET. This has led to the problem that the volume of the capacitor element in the substrate is limited, so the effective capacitance of the capacitor element lowers.

An object of the present invention is to provide a semiconductor memory device which can construct a memory cell in a minute region where a bit line and a word line overlap, and which adopts $\frac{1}{2} V_{cc}$ as the reference potential of the capacitor element of the memory cell.

Another object of the present invention is to provide a semiconductor memory device which can construct a memory cell in a minute region where a bit line and a word line overlap, and in which the capacitance of the capacitor element of the memory cell is high.

The above and other objects and novel features of the present invention will become apparent from the description of this specification and the accompanying drawings.

A typical aspect of performance of the present invention is briefly summarized as follows:

A silicon pillar having the same conductivity type as that of a semiconductor substrate are provided erect on a principal surface of said semiconductor substrate, bit line are extended in a direction parallel to the principal surface of said semiconductor substrate and are connected to side surfaces of lower parts of said silicon pillar, those parts of said silicon pillar to which said bit line are connected are provided with first semiconductor regions having the opposite conductivity type to that of said silicon pillar, second semiconductor regions having the opposite conductivity type to that of said silicon pillar are provided in upper parts of said silicon pillar, gate insulator films are provided on side surfaces of the intermediate parts of said silicon pillar which lie between said first semiconductor region and said second semiconductor region, and word line which extend in a direction parallel to the principal surface of said semiconductor substrate and different from the extending direction of said bit line are provided around said gate insulator film, thereby to construct transfer MISFET of memory cell, and plate electrode is provided around said second semiconductor region through dielectric film, thereby to construct capacitor element of said memory cell. One memory cell constituted by one transfer MISFET and one capacitor element is provided on one silicon pillar.

According to the expedient described above, the plate electrode to which the reference potential of each of the capacitor elements is applied is isolated from the semiconductor substrate, and hence, ½ $V_{cc}$ can be adopted as the reference potential of the capacitor element, so that the dielectric film can be thinned, whereby the capacitance of the capacitor element can be enlarged.

Moreover, the plate electrode is made of a conductor on the semiconductor substrate, and hence, it is not depleted in the mode of writing information, so that the capacitance can be enlarged

DESCRIPTION OF THE PREFERRED EMBODIMENTS

Figure 1:
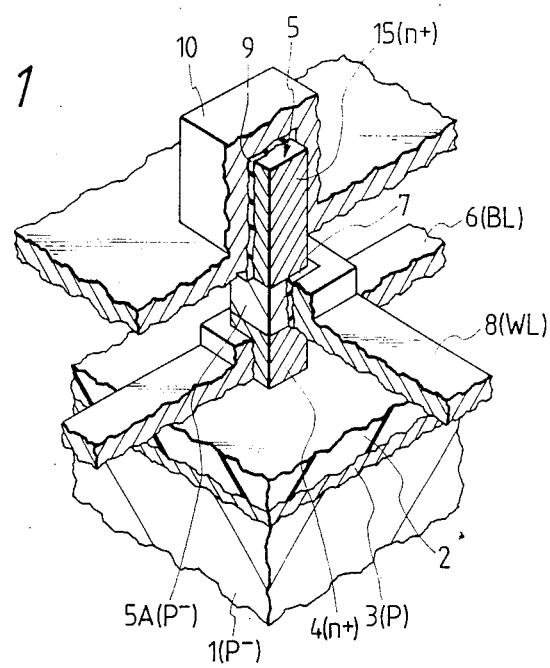
FIG. 1 is a perspective view of the memory cell of a dynamic RAM in an embodiment of the present invention.
Figure 2:
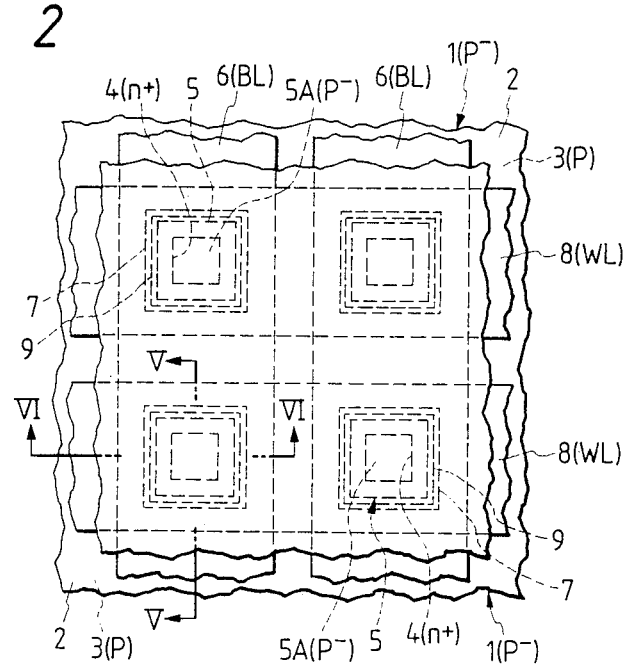
FIG. 2 is a plan view of 4 bits of the memory cells as shown in FIG. 1.
Figure 3:
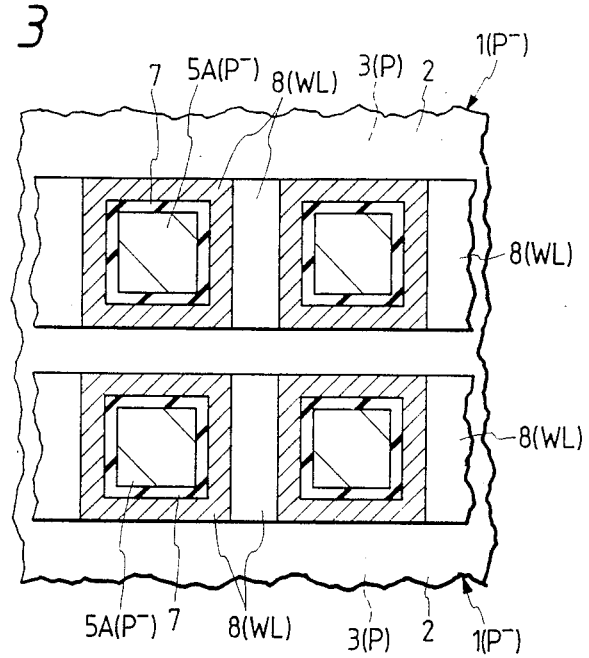
FIG. 3 is a plan view of the portions of the transfer MISFETs of the memory cells in FIG. 2 (portions to which word lines are connected) as sliced in a direction parallel to the principal surface of a semiconductor substrate.
Figure 4:
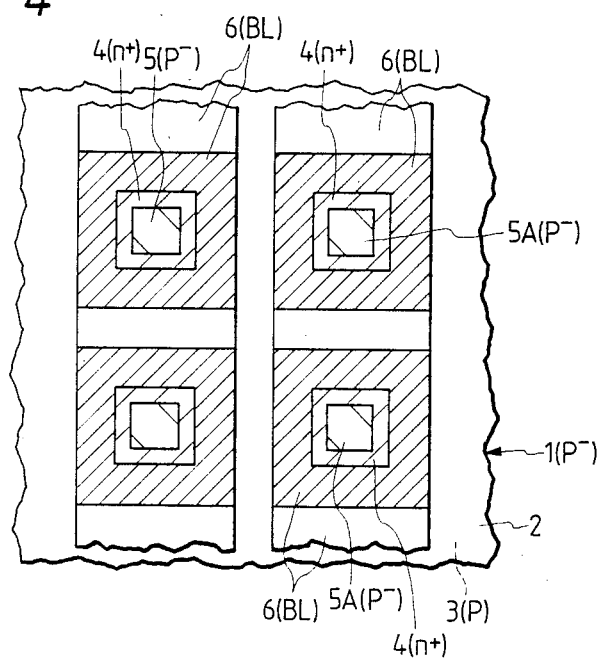
FIG. 4 is a plan view of those portions of the memory cells in FIG. 2 to which bit lines are connected, as sliced in a direction parallel to the principal surface of the semiconductor substrate.
Figure 5:
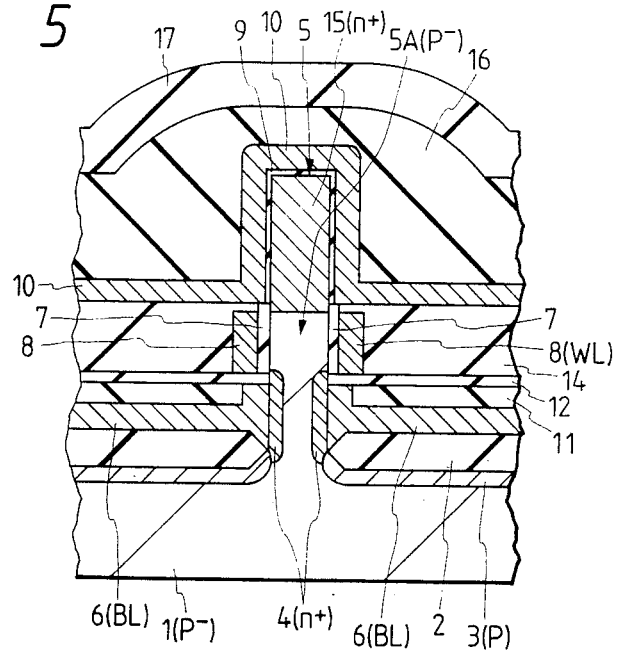
FIG. 5 is a sectional view of the memory cell shown in FIG. 2 as taken along cutting-plane line V—V.
Figure 6:
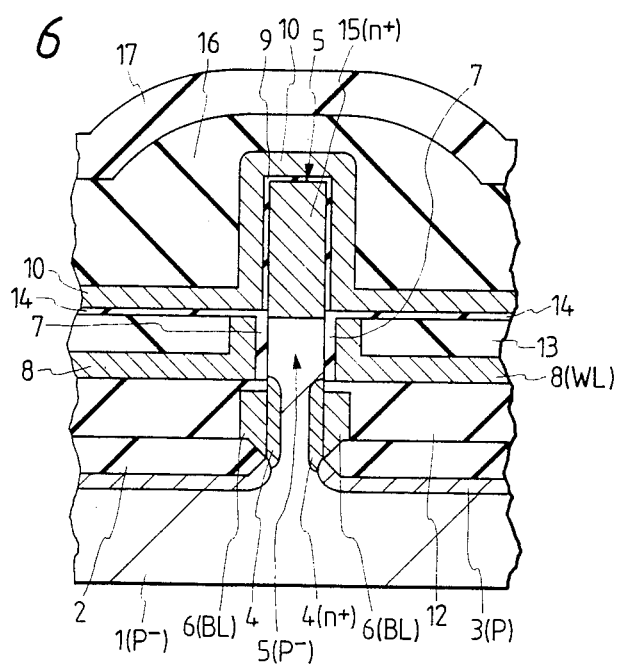
FIG. 6 is a sectional view of the memory cell shown in FIG. 2 as taken along cutting-plane line VI—VI.

Now, an embodiment in which the present invention is applied to a memory cell in a dynamic RAM will be described with reference to the drawings FIG. 1 is a perspective view of the memory cell of the dynamic RAM in one embodiment of the present invention;

FIG. 2 is a plan view of 4 bits of the memory cells as shown in FIG. 1;

FIG. 3 is a plan view of the portions of the transfer MISFETs of the memory cells in FIG. 2;

FIG. 4 is a plan view of those portions of the memory cells in FIG. 2 to which bit lines are connected;

FIG. 5 is a sectional view of the memory cell shown in FIG. 2 as taken along cutting-plane line V—V; and FIG. 6 is a sectional view of the memory cell shown in FIG. 2 as taken along cutting-plane line VI—VI.

By the way, in FIGS. 1 and 2, insulator films between wiring layers are omitted from illustration in order to facilitate understanding of the construction of the memory cell. Throughout the drawings for describing the embodiment, the same symbols are assigned to portions having identical functions and shall not be repeatedly explained.

As shown in FIGS. 1 thru 6, the memory cell of this embodiment comprises a silicon pillar 5 made of single-crystalline silicon. The silicon pillar 5 has a square shape in top plan, but it is not restricted thereto. The length of each side of the square of the silicon pillar 5 as viewed from above is, for example, 1 μm, and the spacing between the adjacent silicon pillars 5 is, for example, about 1.5 μm. The silicon pillars 5 are structurally unitary with a semiconductor substrate 1 made of single-crystal silicon of the p$^-$-type, and are erected (formed) on the semiconductor substrate 1 so as to be substantially perpendicular thereto. A field insulator film 2 made of a silicon oxide film, and a p-type channel stopper region 3 are provided on the part of the front (upper principal) surface of the semiconductor substrate 1 except at the location of the silicon pillars 5.

The transfer MISFET of the memory cell is configured of an n$^+$-type semiconductor region 4 at the lower part of the silicon pillar 5, a p$^-$-type semiconductor region 5A at the intermediate part portion of the silicon pillar 5, a gate insulator film 7 which is made of a silicon oxide film formed on the side surfaces of the p$^-$-type semiconductor region 5A, a word line 8 which is connected to the periphery of the gate insulator film 7 and which extends in a direction parallel to the principal surface of the semiconductor substrate 1, and an n$^+$-type semiconductor region 15 at the upper part of the silicon pillar 5. The p$^-$-type semiconductor region 5A serves as the channel region of the transfer MISFET. The n$^+$-type semiconductor region 4 at the lower part of the silicon pillar 5 is formed in proximity to the side surfaces of this silicon pillar 5 as illustrated in FIG. 4, and the central part of the silicon pillar 5 on which the n$^+$-type semiconductor region 4 is formed is a p$^-$-type region. A bit line 6 is surroundingly connected to the side surfaces of the n$^+$-type semiconductor region 4. In addition, the bit line 6 is extended on the field insulator film 2 in a direction which is parallel to the principal surface of the semiconductor substrate 1 and which is substantially orthogonal to the word line 8. That part of the word line 8 which is connected to the gate insulator film 7 is provided so as to surround the periphery of the p$^-$-type semiconductor region 5A. The part of the silicon pillar 5 where the n$^+$-type semiconductor region 15 is formed, is made up of a semiconductor region of the n$^+$-type from the outer surface to the central part of the silicon pillar 5. Besides, the upper end part of the n$^+$-type semiconductor region 4 is somewhat extended along the side parts of the word line 8, while the lower end part of the n$^+$-type semiconductor region 15 is somewhat extended along the side parts of the word line 8. Thus, when the potential of the word line 8 is set at its high level (for example, 5 V), the n$^+$-type semiconductor region 4 and the n$^+$-type semiconductor region 15 are favorably rendered conductive therebetween.

The capacitor of the memory cell is configured of the n$^+$-type semiconductor region 15 at the upper end part of the silicon pillar 5, a dielectric film 9 which is made of, for example, a silicon oxide film formed on the outer surface of the n$^+$-type semiconductor region 15, and one electrode (plate electrode) 10 of this capacitor element, which is provided so as to cover the n$^+$-type semiconductor region 15 in contact with the outer surface of the dielectric film 9. The n$^+$-type semiconductor region 15 serves both as either the source or drain of the transfer MISFET, and as the other electrode (storage node) of the capacitor. The plate electrode 10 is in the shape of a single plate so as to cover the n+-type semiconductor regions 15 of all the silicon pillars 5 on the semiconductor substrate 1. Incidentally, although no restriction is meant, the thickness of the dielectric film 9 is less than that of the gate insulator film 7. Since, in this manner, the n+-type semiconductor region 15 is provided at the upper part of the silicon pillar 5, the area thereof lying in contact with the p⁻-type semiconductor region 5A is very small, and hence, the leakage of written information into the semiconductor substrate 1 is slight. Moreover, the plate electrode 10 being one electrode of the capacitor element is provided on the semiconductor substrate 1 through the field insulator film 2, a first-layer insulator film 11, a second-layer insulator film 12, a third-layer insulator film 13 and a fourth-layer insulator film 14. Therefore, a potential unequal to that of the semiconductor substrate 1, for example, a potential of about ½ of a power source potential $V_{cc}$, namely, ½ $V_{cc}$ can be applied to the plate electrode 10. A ground potential $V_{ss}$, for example, 0 V or a still lower potential is applied to the semiconductor substrate 1. The first-layer insulator film 11 is made of, for example, a silicon oxide film, and each of the second-layer insulator film 12, third-layer insulator film 13 and fourth-layer insulator film 14 is made of, for example, a silicon oxide film or a PSG (phosphosilicate glass) film.

Each of the bit line 6, word line 8 and plate electrode 10 is made of, for example, a double-layer film (polycide film) in which a tungsten silicide film is stacked on an n+-type polycrystalline silicon film. The bit line 6 and the word line 8 are insulated by the insulator films 11 and 12. The insulator film 11 is disposed only on the bit lines 6, and it is not disposed on the interspaces between the bit lines 6. The insulator film 12 is buried in the interspaces between the bit lines 6. The word line 8 and the plate electrode 10 are insulated by the insulator films 13 and 14. The insulator film 13 is disposed only on the word lines 8, and it is not disposed on the interspaces between the word lines 8. The insulator film 14 is buried in the interspaces between the word lines 8. Numeral 16 indicates a fifth-layer insulator film which insulates the plate electrode 10 and the aluminum wiring of a peripheral circuit not shown, and which is made of, for example, a silicon oxide film, a PSG film or a silicon nitride film. Numeral 17 indicates a passivation film at the uppermost layer, which is made of, for example, a silicon oxide film or a silicon nitride film deposited by CVD.

Figure 7:
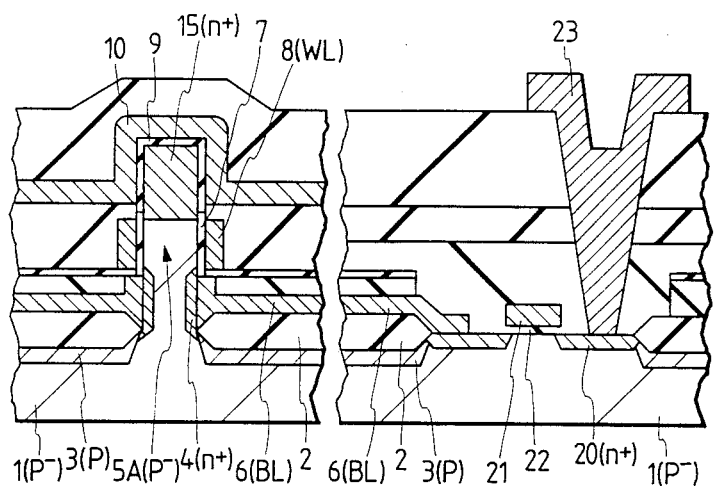
FIG. 7 is a sectional view showing an example of the connection between the bit line 6 illustrated in FIG. 4 and a peripheral circuit.

Now, FIG. 7 is a sectional view showing an example of the connection between the bit line 6 and a MISFET constituting a peripheral circuit. In the figure, a domain A illustrates the section of the memory cell, and a domain B the section of the N-channel MISFET constituting the peripheral circuit.

As depicted in the domain B of FIG. 7, the N-channel MISFET constituting the peripheral circuit is made up of two n+-type semiconductor regions 20 which serve as a source and a drain, respectively, a gate insulator film 22 which is formed of a thin silicon oxide film on the front surface of the semiconductor substrate 1, and a gate electrode 21 which is configured of, for example, a polycrystalline silicon film and a tungsten silicide film formed of the same layer as that of the word line 8. The bit line 6 is connected to one of the two n+-type semiconductor regions 20. Aluminum wiring 23 is connected to the other n+-type semiconductor region 20.

Now, a method of manufacturing the memory cell will be described.

FIGS. 8 thru 30 are sectional views for explaining the manufacturing steps of the memory cell of the dynamic RAM as shown in FIG. 1, and each of the sectional views corresponds to the same portion as in FIG. 5 or FIG. 6.

Figure 8:
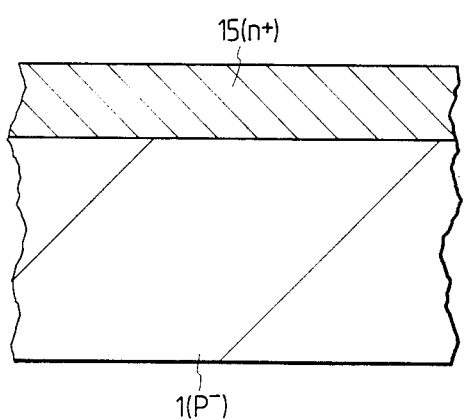
FIGS. 8 thru 30 are sectional views of the same part as in FIG. 5 or FIG. 6, for explaining the manufacturing steps of the memory cell of the dynamic RAM shown in FIG. 1.
Figure 9:
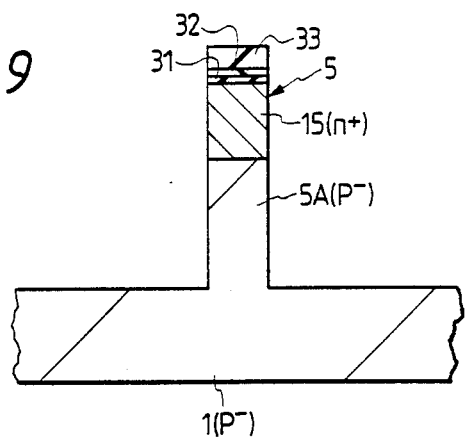
Figure 10:
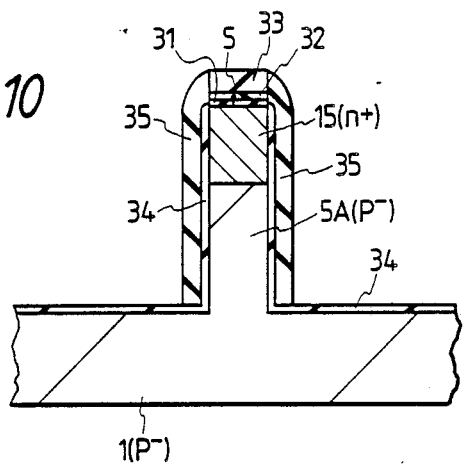
Figure 11:
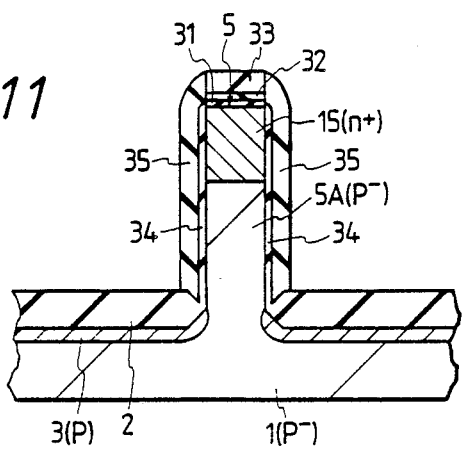
Figure 12:
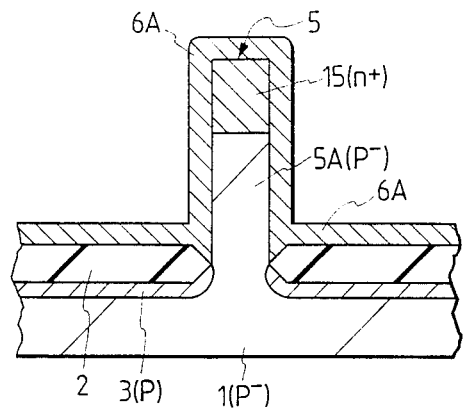
Figure 13:
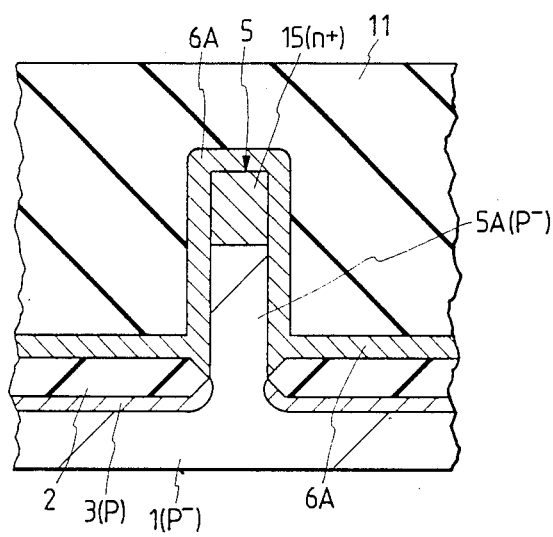
Figure 14:
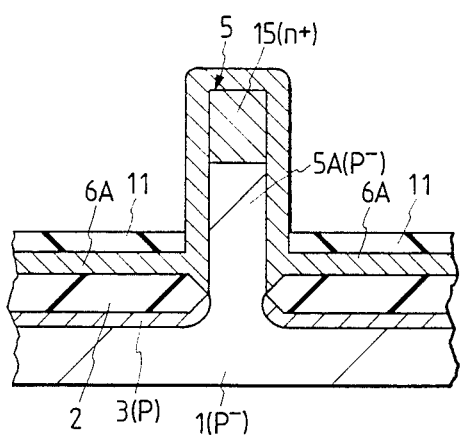
Figure 15:
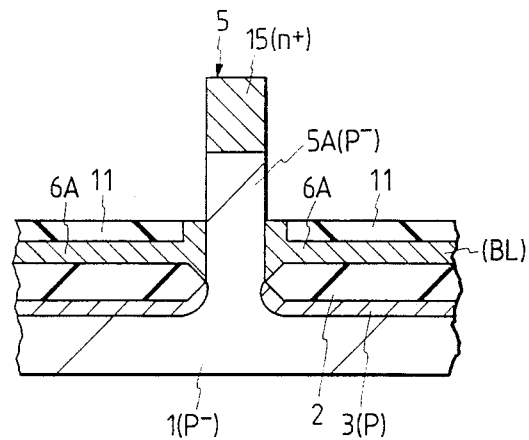
Figure 16:
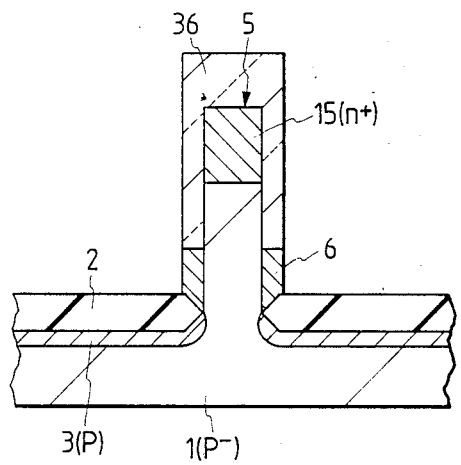
Figure 17:
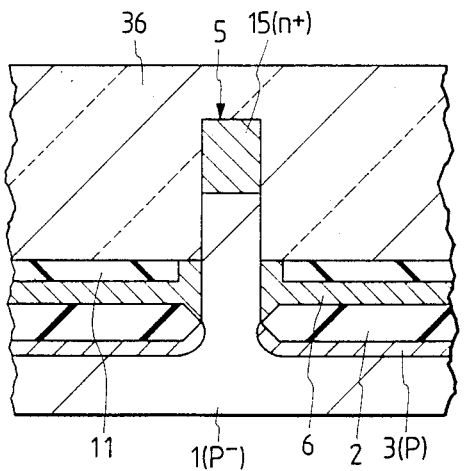

According to the method of manufacturing the memory cell in this embodiment, first of all, as shown in FIG. 8, an n+-type semiconductor region 15 is epitaxially grown on a semiconductor substrate 1 made of p⁻-type single-crystalline silicon. Subsequently, as shown in FIG. 9, the front surface of the n+-type semiconductor region 15 is thermally oxidized to form a thin silicon oxide film 31, which is overlaid with a silicon nitride film 32 by, for example, CVD, and this film 32 is further overlaid with a phosphosilicate glass (PSG) film 33 by, for example, CVD. The PSG film 33, silicon nitride film 32 and silicon oxide film 31 are processed into the pattern of silicon pillars 5 by etching which employs a resist film, not shown, as a mask. Thereafter, the resist film is removed, whereupon those parts of the n+-type semiconductor region 15 and the semiconductor substrate 1 which are exposed out of the PSG film 33, silicon nitride film 32 and silicon oxide film 31 are etched by, for example, reactive ion etching (RIE) so as to form the silicon pillars 5. The silicon pillar 5 is made up of the n+-type semiconductor region 15, and a p⁻-type semiconductor region 5A underlying it. Next, the side surfaces of each silicon pillar 5 and the front surface of the semiconductor substrate 1 are thermally oxidized to form a thin silicon oxide film 34 (FIG. 10). Next, a silicon nitride film 35 (FIG. 10), for example, is formed so as to cover the PSG film 33, silicon nitride film 32, silicon oxide film 31, silicon pillars 5 and semiconductor substrate 1. Thereafter, as shown in FIG. 10, the silicon nitride film 35 is etched by anisotropic etching such as RIE until the silicon oxide film 34 on the front surface of the semiconductor substrate 1 is exposed. By this etching, the silicon nitride film 35 can be left on only the side parts of each of the silicon pillars 5. Subsequently, a p-type impurity, for example, boron (B) for forming a p-channel stopper region 3 is introduced into the whole front surface part of the semiconductor substrate 1 except the silicon pillars 5 by ion implantation. Thereafter, using the silicon nitride films 32 and 35 as a mask against thermal oxidation, the front surface of the semiconductor substrate 1 exposed out of them is thermally oxidized to form a field insulator film 2 as shown in FIG. 11. Thereafter, the silicon nitride film 35, silicon oxide film 34, PSG film 33, silicon nitride film 32 and silicon oxide film 31 are respectively removed to expose the outer surfaces of the silicon pillars 5. Next, as shown in FIG. 12, a double-layer film 6A made up of, for example, a polycrystalline silicon film and a tungsten silicide film for forming bit lines 6 are formed on the surfaces of the silicon pillars 5 and the field insulator film 2 by, for example, CVD. Used as the polycrystalline silicon film of the double-layer film is an n+-type polycrystalline silicon film into which an n-type impurity, for example, As is introduced. Next, as shown in FIG. 13, an insulator film 11 made of a silicon oxide film or the like is formed on the double-layer film 6A by bias sputtering so as to become sufficiently thick until its upper surface flattens. Subsequently, as shown in FIG. 14, the insulator film 11 is etched back to a predetermined thickness, thereby to expose the structure above the intermediate positions of those parts of the double-layer film 6A which cover the p⁻-type semiconductor regions 5A constituting the silicon pillars 5. Subsequently, as shown in FIG. 15 (a sectional view of the same portion as in FIG. 5, before each bit line 6 is formed by patterning the double-layer film 6A), the exposed part of the double-layer film 6A is etched by isotropic etching so as to expose the silicon pillar 5 (the p⁻-type semiconductor region 5A and the n⁺-type semiconductor region 15). Subsequently, a resist film 36 having the pattern of the bit lines 6 is formed on the silicon pillars 5, double-layer film 6A and insulator film 11. At the next step, the parts of the insulator film 11 exposed out of the resist film 36 are etched by, for example, RIE so as to expose the underlying double-layer film 6A, whereupon the exposed parts of the double-layer film 6A are etched by, for example, RIE thereby to be patterned. Thus, as shown in FIG. 16 (the same portion as in FIG. 5) and FIG. 17 (the same portion as in FIG. 6), each bit line 6 is formed After the formation of the bit lines 6, the resist film 36 is removed.

Figure 18:
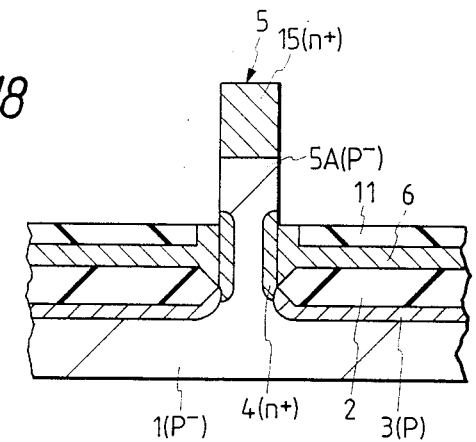
Figure 19:
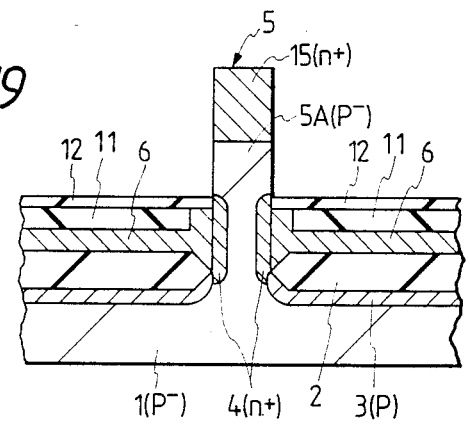
Figure 20:
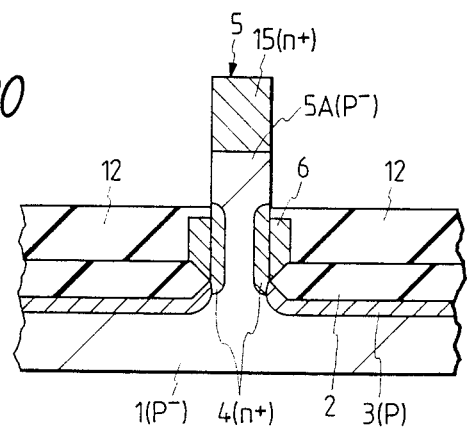
Figure 21:
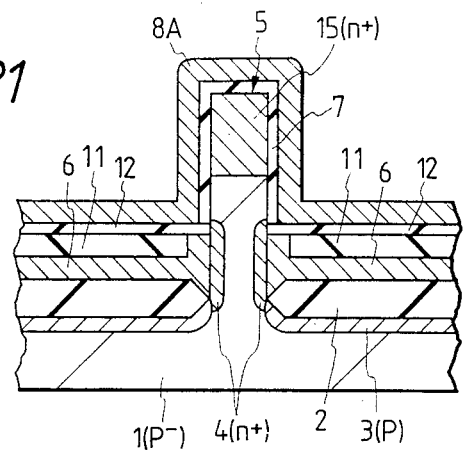
Figure 22:
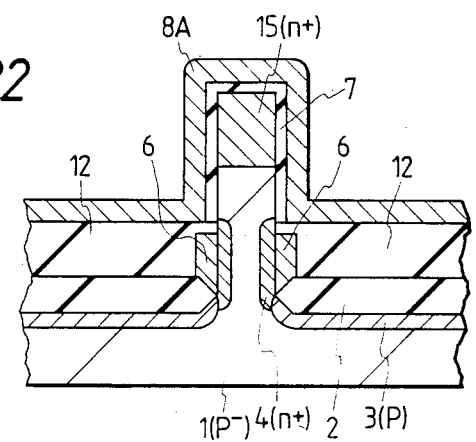
Figure 23:
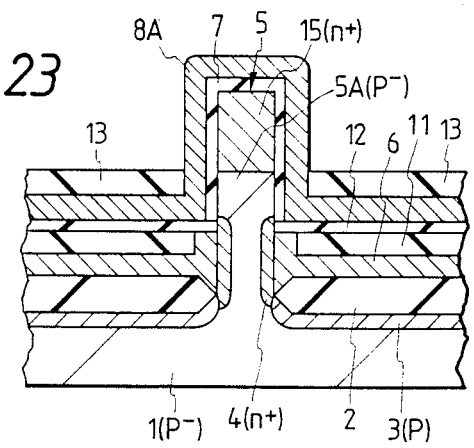
Figure 24:
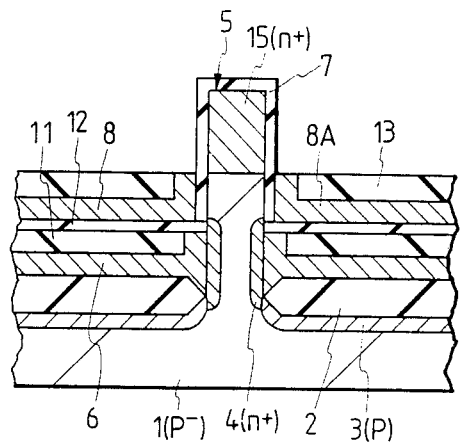
Figure 25:
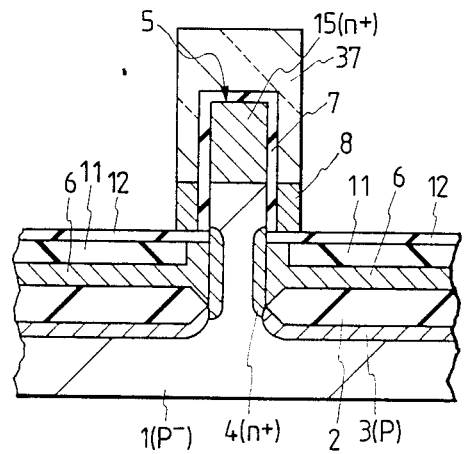
Figure 26:
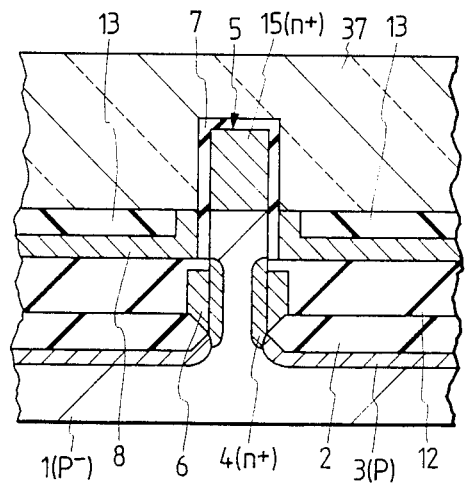
Figure 27:
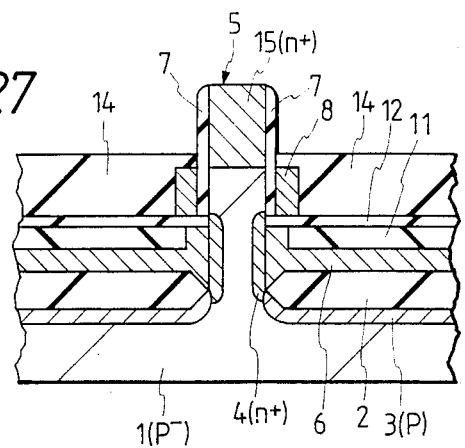
Figure 28:
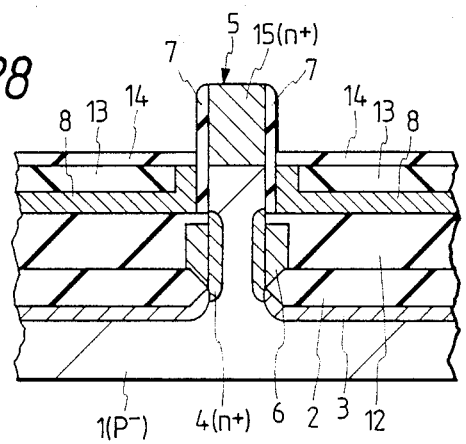
Figure 29:
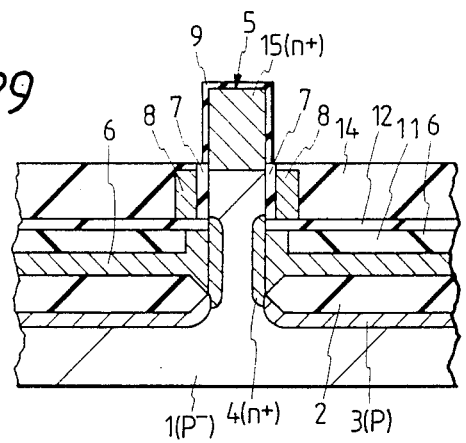
Figure 30:
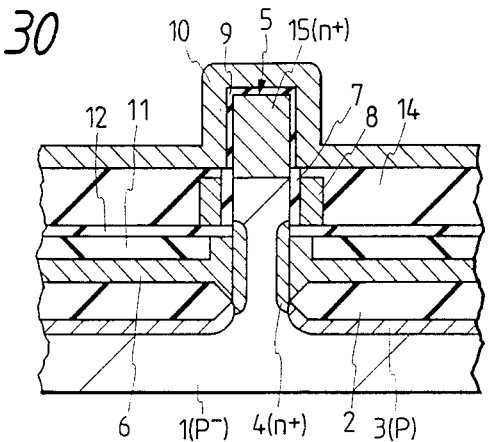

Subsequently, as shown in FIG. 18, the n-type impurity, for example, As in the polycrystalline silicon film of each bit line 6 is diffused into the silicon pillar 5 by a heat treatment, thereby to form an n⁺-type semiconductor region 4. Next, a silicon oxide film or a PSG film is deposited by, for example, bias sputtering so as to become thick until its upper surface flattens. Thereafter, the deposited film is etched back until the upper end of the n⁺-type semiconductor region 4 appears, whereby an insulator film 12 is formed as shown in FIG. 19 (the same portion as in FIG. 5) and FIG. 20 (the same portion as in FIG. 6). The insulator film 12 buries the interspaces between the respectively adjacent bit lines 6, and yet, the upper surface thereof is flat. Next, as shown in FIG. 21 (the same portion as in FIG. 5) and FIG. 22 (the same portion as in FIG. 6), that surface of each silicon pillar 5 which is exposed out of the bit line 6 and the insulator films 11, 12 is thermally oxidized to form a gate insulator film 7. Next, a double-layer film 8A made up of, for example, a polycrystalline silicon film and a tungsten silicide film for forming word lines 8 are deposited on the whole surfaces of the insulator film 12 and each gate insulator film 7 by, for example, CVD. Subsequently, a silicon oxide film or a PSG film is formed by, for example, bias sputtering so as to become thick until its upper surface flattens. Thereafter, using anisotropic etching such as RIE, the deposited film is etched back to the lower end part of the n⁺-type semiconductor region 15 thereby to form an insulator film 13 as shown in FIG. 23. Then, the structure above the intermediate part of the double-layer film 8A which covers the silicon pillar 5 and the insulator film 7 is exposed out of the insulator film 13. Next, as shown in FIG. 24, those parts of the double-layer film 8A which are exposed out of the insulator film 13 are removed by isotropic etching. Next, a resist film 37 (FIGS. 25 and 26) for forming the word lines 8 are patterned. Thereafter, the parts of the insulator film 13 exposed out of the resist film 37 are etched by, for example, RIE, whereupon the exposed parts of the double-layer film 8A are etched. Thus, each word line 8 is formed as shown in FIG. 25 (the same portion as in FIG. 5) and FIG. 26 (the same portion as in FIG. 6). Thereafter, the resist film 37 is removed. Subsequently, a silicon oxide film or a PSG film, for example, is formed by bias sputtering so as to become thick until its upper surface flattens. Thereafter, the sputtered film is etched back to a predetermined thickness thereby to form an insulator film 14 as shown in FIG. 27 (the same portion as in FIG. 5) and FIG. 28 (the same portion as in FIG. 6). The insulator film 14 buries the interspaces between the respectively adjacent word lines 8, and yet, the upper surface thereof is flat. The part of the gate insulator film 7 on the side surfaces of each n⁺-type semiconductor region 15 is exposed. Incidentally, the part of the gate insulator film 7 formed on the upper surface of each n⁺-type semiconductor region 15 has already been etched at the etching-back step for forming the insulator film 14. Subsequently, each of the exposed parts of the gate insulator film 7 is isotropically etched to expose the outer surface of the n⁺-type semiconductor region 15. Thereafter, as shown in FIG. 29, a dielectric film 9 made of a silicon oxide film is formed on the outer surface of the n⁺-type semiconductor region 15 by thermal oxidation. Subsequently, as shown in FIG. 30, a plate electrode 10 in the shape of a double-layer film made up of a polycrystalline silicon film and a tungsten silicide film is formed by, for example, CVD. Thereafter, an insulator film 16 shown in FIGS. 5 and 6, aluminum wiring 23 shown in FIG. 7, and a passivation film 17 shown in FIGS. 5 and 6 are formed in succession.

A method of manufacturing the N-channel MISFET which constitutes the peripheral circuit, is as follows: Before the n⁺-type epitaxial layer 15 is formed on the domain of the semiconductor substrate 1 where the memory cells are to be formed, the domain of the semiconductor substrate 1 where the peripheral circuit is to be formed is covered with a double-layer film which is made up of a silicon oxide film and a nitride film produced by, for example, CVD and which is used as a mask against the epitaxial layer growth and etching for forming the silicon pillars 5 of the memory cells. The insulator film formed of this double-layer film is removed after the formation of the insulator film 12 on the memory cell domain. Subsequently, only the front surface of the semiconductor substrate corresponding to the peripheral circuit domain is thermally oxidized. Thereafter, a gate electrode 21 made of the same conductor layer as that of the word line 8 is formed. By way of example, n⁺-type semiconductor regions 20 to function as a source and a drain are formed in such a way that, after the formation of the insulator film 16 on the memory cell domain, an n-type impurity is introduced by ion implantation employing the gate electrode 21 as a mask. Subsequent steps conform to known techniques.

Figure 31:
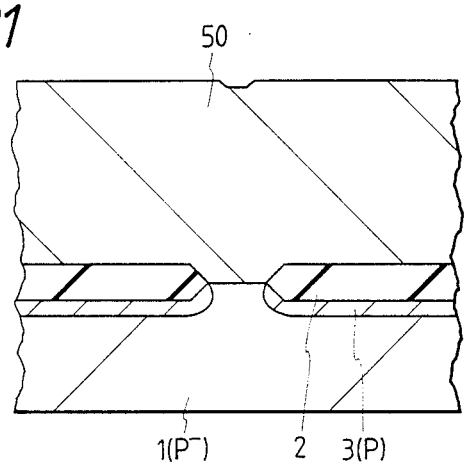
FIGS. 31 and 32 are sectional views of a memory cell portion for elucidating a method of forming a silicon pillar 5, this method being different from a forming method which is explained in the process for manufacturing the memory cell.
Figure 32:
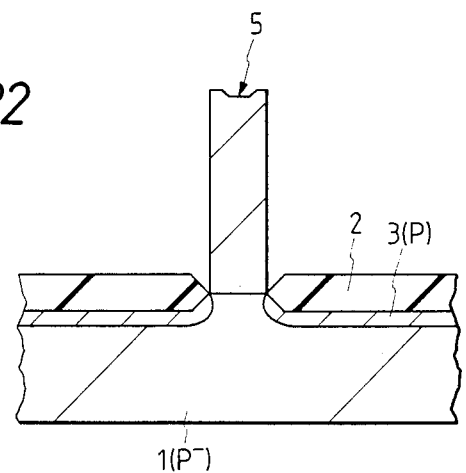

By the way, as illustrated in FIGS. 31 and 32, the silicon pillars 5 can also be formed by annealing a polycrystalline silicon film into a single crystal.

FIGS. 31 and 32 are sectional views of a memory cell portion for elucidating a method of forming the silicon pillar 5, which method differs from the method of forming the silicon pillar 5 explained in the foregoing method of manufacturing the memory cell.

According to the different method of forming the silicon pillar 5, as shown in FIG. 31, a polycrystalline silicon film 50 is first formed by, for example, CVD so as to cover the field insulator film 2 and the part of the semiconductor substrate 1 exposed out of the field insulator film 2. The thickness of the polycrystalline silicon film 50 is set at a degree necessary for the formation of the silicon pillar 5. Subsequently, a resist film, not shown, for forming the silicon pillar 5 is formed on the polycrystalline silicon film 50. Thereafter, the part of the polycrystalline silicon film 50 exposed out of the resist film is etched by RIE, whereby the silicon pillar 5 is formed as shown in FIG. 32. After the etching, the resist film is removed. At this stage, the silicon pillar 5 is not in the form of a single crystal, but it is polycrystalline yet. Thereafter, the silicon pillar 5 made of the polycrystalline silicon film is turned into the single crystal by heating the resultant structure at a predetermined temperature.

As described above, according to the memory cell of the present invention, silicon pillars 5 having the same conductivity type as that of a semiconductor substrate 1 are provided outwardly therefrom in a direction perpendicular to a principal surface of said semiconductor substrate 1, bit lines 6 are extended in a direction parallel to the principal surface of said semiconductor substrate 1 and are connected to side surfaces of lower parts of said silicon pillars 5, those parts of said silicon pillars 5 to which said bit lines 6 are connected are provided with first semiconductor regions 4 having the opposite conductivity type to that of said silicon pillars 5, second semiconductor regions 15 having the opposite conductivity type to that of said silicon pillars 5 are provided in upper parts of said silicon pillars 5, gate insulator films 7 are provided on side surfaces of intermediate parts of said silicon pillars 5, and word lines 8 which extend in a direction parallel to the principal surface of said semiconductor substrate 1 and in a direction substantially perpendicular to said bit lines 6 are provided around said gate insulator films 7, thereby to construct transfer MISFETs of the memory cells, and plate electrodes 10 are provided around said second semiconductor regions 15 through dielectric films 9, thereby to construct capacitors of said memory cells, whereby said plate electrode 10 of said each capacitor lies above said semiconductor substrate 1 in isolation from this semiconductor substrate 1, so that $\frac{1}{2} V_{cc}$ can be adopted as the reference potential of said capacitor, and hence, said dielectric film 9 can be thinned.

Moreover, since said plate electrode 10 is made of a conductor provided above said semiconductor substrate 1, it is not depleted in the mode of writing information, and the capacitance of said capacitor can therefore be enlarged.

Besides, since that part of said $n^+$-type semiconductor region 15 being one electrode of said capacitor which lies in contact with a $p^-$-type semiconductor region 5A is very small, charges serving as information leaks little into said $p^-$-type semiconductor region 5A, and the retention time of the information can be lengthened.

Although, in the above, the present invention has been specifically described in conjunction with exemplifying embodiments illustrated, it is needless to say that the present invention is not restricted to the foregoing embodiments, but that it can be variously altered within a scope not departing from the purport thereof.

Effects which are attained by the typical aspects of performance of the present invention are briefly explained as follows:

Since the plate electrode of each capacitor lies above a semiconductor substrate in isolation from the semiconductor substrate, $\frac{1}{2} V_{cc}$ can be adopted as the reference potential of the capacitor element, and hence, a dielectic film can be thinned.

Since the plate electrode is made of a conductor, it is not depleted in the mode of writing information, and hence, the capacitance of the capacitor element can be heightened.

What is claimed is:

1. A semiconductor integrated circuit device having memory cells in which each is configured of a transfer MISFET and a storage capacitor, comprising:
   a semiconductor substrate of a first conductivity type, which has a principal surface;
   silicon pillars, which respectively include lower, intermediate and upper parts in that order outwardly from the semiconductor substrate, being respectively disposed on said principal surface and having side surfaces, each pillar extending outwardly from said semiconductor substrate in a direction perpendicular to the principal surface thereof;
   first semiconductor regions of a second conductivity type, each one thereof being formed at a side surface of a lower part of a corresponding one of said silicon pillars;
   a plurality of bit lines each extended over said semiconductor substrate and connected to respective ones of said first semiconductor regions;
   second semiconductor regions being of a second conductivity type, each one thereof being formed at a side surface of an upper part of a corresponding one of said silicon pillars;
   a dielectric film formed on the side surface of the upper part of each one of said silicon pillars;
   a conductor film, formed on said dielectric film;
   third semiconductor regions of said first conductivity type, each one thereof being formed in an intermediate part of a corresponding silicon pillar between the corresponding first and second semiconductor regions thereof;
   a gate insulating film formed on the side surface of the intermediate part of each one of said silicon pillars; and
   a plurality of word lines, each one thereof being formed on said gate insulating film and over said plurality of bit lines and extending in a direction orthogonal to said plurality of bit lines, wherein said transfer MISFET of each one of said memory cells is constructed of said word line, said gate insulating film, and said first, second and third semiconductor regions associated therewith, while said storage capacitor of each one of said memory cell is constructed of said second semiconductor region of a corresponding silicon pillar, said dielectric film associated therewith, and said conductor film, and further wherein said third semiconductor regions are electrically connected to said semiconductor substrate.

2. A semiconductor integrated circuit device according in claim 1, further comprising: a field insulator film being disposed on the principal surface of said substrate for respectively isolating said silicon pillars, and wherein said semiconductor substrate and said bit lines are respectively insulated from each other by the field insulator film.

3. A semiconductor integrated circuit device according to claim 1, wherein said word line, said gate insulating film, said third semiconductor region, and said first and second semiconductor regions corresponding to each silicon pillar are disposed so as to construct a gate electrode, a gate insulator film, a channel forming region, and source and drain regions, respectively, of a transfer MISFET of a corresponding memory cell.

4. A semiconductor integrated circuit device according to claim 3, wherein said conductor film and said second semiconductor region of a respective silicon pillar construct one electrode and the other electrode of the storage capacitor of a corresponding memory cell, respectively.

5. A semiconductor integrated circuit device according to claim 4, wherein a voltage which is equal or near to a half of a power source voltage employed in said device is applied to said conductor film.

6. A semiconductor integrated circuit device according to claim 4, wherein said first and second conductivity types are p- and n-types, respectively.

7. A semiconductor integrated circuit device according to claim 4, wherein a voltage which is lower than a ground potential is applied to said semiconductor substrate.

8. A semiconductor integrated circuit device according to claim 1, wherein a voltage which is equal or near to a half of a power source voltage employed in said device is applied to said conductor film.

9. A semiconductor integrated circuit device according to claim 2, wherein said word line, said gate insulating film, said third semiconductor region, and said first and second semiconductor regions corresponding to each silicon pillar are disposed so as to construct a gate electrode, a gate insulator film, a channel forming region, and source and drain regions, respectively, of a transfer MISFET of a corresponding memory cell.

10. A semiconductor integrated circuit device according to claim 9, wherein said conductor film and said second semiconductor region of a respective silicon pillar construct one electrode and the other electrode of the storage capacitor of a corresponding memory cell, respectively.

11. A semiconductor integrated circuit device according to claim 10, wherein a voltage which is equal or near to a half of a power source voltage employed in said device is applied to said conductor film.

12. A semiconductor integrated circuit device according to claim 11, wherein said first and second conductivity types are p- and n-types, respectively.

13. A semiconductor integrated circuit device according to claim 12, wherein said conductor film is a single conductor film for forming said one electrode of all of said memory cells.

14. A semiconductor integrated circuit device according to claim 1, wherein said conductor film is a single conductor film for forming said one electrode of all of said memory cells.

15. A semiconductor integrated circuit device according to claim 14, wherein said plurality of word and bit lines comprise double-layer polycide films.

* * * * *